United States Patent
Chang et al.

(10) Patent No.: US 6,744,124 B1
(45) Date of Patent: Jun. 1, 2004

(54) SEMICONDUCTOR DIE PACKAGE INCLUDING CUP-SHAPED LEADFRAME

(75) Inventors: Mike Chang, Cupertino, CA (US); King Owyang, Atherton, CA (US); Yueh-Se Ho, Sunnyvale, CA (US); Y. Mohammed Kasem, Santa Clara, CA (US); Lixiong Luo, San Jose, CA (US); Wei-Bing Chu, Shanghai (CN)

(73) Assignee: Siliconix Incorporated, Santa Clara, CA (US)

( * ) Notice: Subject to any disclaimer, the term of this patent is extended or adjusted under 35 U.S.C. 154(b) by 0 days.

(21) Appl. No.: 09/468,249

(22) Filed: Dec. 10, 1999

(51) Int. Cl.[7] .................. H01L 23/22; H01L 23/24; H01L 23/06; H01L 23/48
(52) U.S. Cl. .................. 257/678; 257/684; 257/687; 257/690
(58) Field of Search ................. 257/678, 684, 257/687, 690

(56) References Cited

U.S. PATENT DOCUMENTS 3,857,993 A * 12/1974 Gregory .................. 174/52
5,977,630 A * 11/1999 Woodworth et al. ......... 257/712
5,990,500 A * 11/1999 Okazaki ..................... 257/99
6,046,501 A * 4/2000 Ishikawa et al. ............ 257/730

FOREIGN PATENT DOCUMENTS

| JP | 8-335720 | * 12/1976 |
| JP | 6-177429 | * 6/1994 |
| JP | 9-64421 | * 3/1997 |

* cited by examiner

Primary Examiner—Long Pham
Assistant Examiner—Shrinivas H. Rao
(74) Attorney, Agent, or Firm—Wagner, Murabito, & Hao LLP

(57) ABSTRACT

A semiconductor package includes a leadframe which is cup-shaped and holds a semiconductor die. The leadframe is in electrical contact with a terminal on one side of the die, and the leads of the leadframe are bent in such a way that portions of the leads are coplanar with the other side of the die, which also contains one or more terminals. A plastic capsule is formed around the leadframe and die.

9 Claims, 2 Drawing Sheets

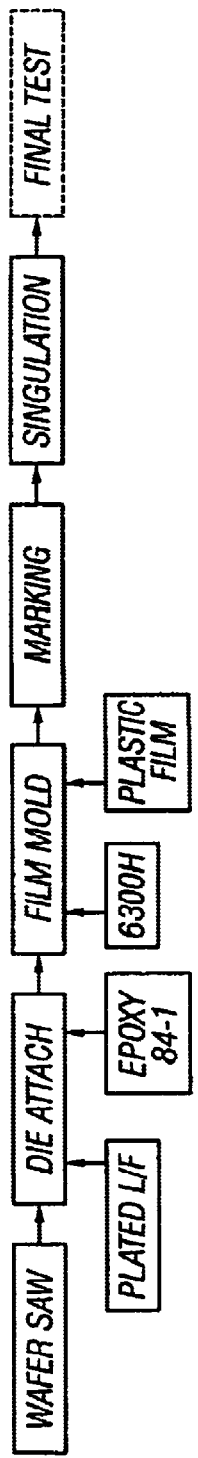
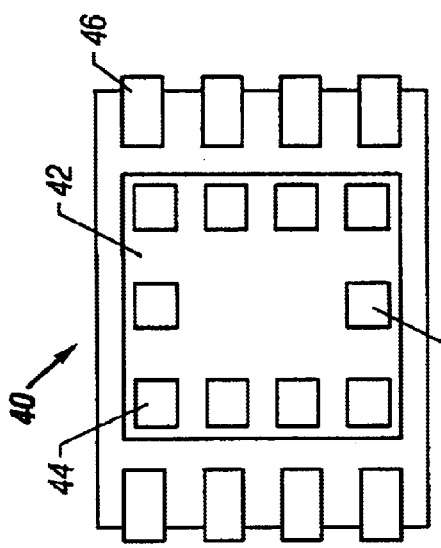
FIG. 5
FIG. 6
FIG. 7

SEMICONDUCTOR DIE PACKAGE INCLUDING CUP-SHAPED LEADFRAME

FIELD OF THE INVENTION

This invention relates to packages for semiconductor dies and in particular a package for a semiconductor die that has terminals on both sides of the die.

BACKGROUND OF THE INVENTION

There is a continuing need for packages for semiconductor dies that are compact, easy to manufacture and economical. There is a particular need for packages that can be used to make connections to terminals on both sides of the die. For example, vertical power MOSFETs, whether of the planar or trench-gated variety, typically have source and gate terminals on the frontside of the die and a drain terminal on the backside of the die. The package must therefore provide connectibility to both sides of the die. Similarly, integrated circuits may need a ground contact to the frontside to minimize transient effects.

In addition, the package should maximize the electrical and thermal conductivity from the die to the printed circuit board on which the die is mounted.

SUMMARY OF THE INVENTION

These objectives are achieved in a semiconductor package in accordance with this invention. The package comprises a semiconductor die having first and second sides. A first electrical terminal of the die is located on the first side, and at least a second electrical terminal of the die is located on the second side. The package also includes a leadframe in electrical contact with the first terminal, the leadframe being formed in the shape of a cup. The die is located in the cup, and at least one lead of the leadframe contains a portion that is coplanar with the second side of the die. A protective plastic capsule can be formed on both sides of the cup.

When the package is mounted on, for example, a printed circuit board (PCB), the first electrical terminal is electrically connected to the PCB via the leadframe. The second electrical terminal is connected to the PCB directly using solder or another conductive material.

The package is particularly suitable for use with power MOSFETs which require a contact to the backside (drain) terminal, but it can also be used with any integrated circuit die where contact must be made to both sides of the die.

The package of this invention is easy to manufacture and can be made very thin (i.e., less than 1 mm thick).

BRIEF DESCRIPTION OF THE DRAWINGS

FIG. 5 is a flow chart of a process for manufacturing the semiconductor package.

FIG. 6 is a cross-sectional view of an alternative embodiment of the invention.

FIG. 7 is a bottom view of a package for an integrated circuit die in accordance with this invention.

DESCRIPTION OF THE INVENTION

Figure 1:
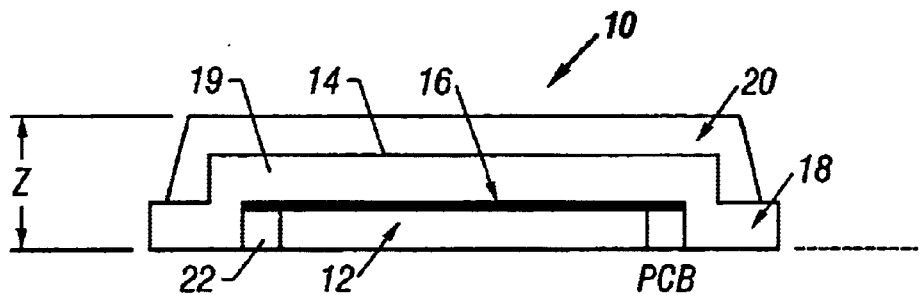
FIG. 1 shows a cross-sectional view of a semiconductor package in accordance with this invention.

FIG. 1 shows a cross-sectional view of a semiconductor package 10 in accordance with this invention. Semiconductor package 10 includes a semiconductor die 12 and a leadframe 14, which is preformed in the shape of a cup. The die 12, which in this embodiment contains a vertical MOSFET, is located inside the "cup". One side of die 12 (the backside) contains a drain terminal (not shown), which is electrically connected to leadframe 14 by means of a layer 16 of conductive epoxy or another type of conductive cement. Each of the individual leads 19 of leadframe 14 includes a portion 18 that is coplanar with the second side of the die 12. A capsule 20 made of a plastic material is in contact with the outside of the "cup", and a portion 22 of the plastic material is injected into a region inside the "cup" between the edge of die 12 and leadframe 14. The molding process used in the manufacture of package 10 ensures that the frontside of die 12 is left uncovered by the plastic material.

Figure 3:
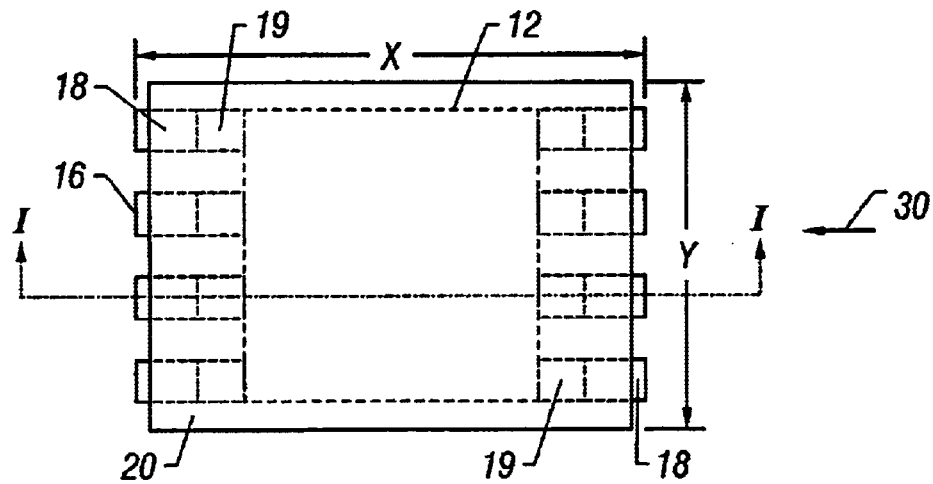
FIG. 3 shows a top view of the semiconductor package.

FIG. 1 is taken at cross-section I—I shown in FIG. 3, which is a top view of semiconductor package 10. As shown, package 10 has a length X which could be 240 mils and a width Y which could be 200 mils. Die 12 is shown in dashed lines in FIG. 3. As shown in FIG. 1, package 10 has a thickness Z that can be 0.7 mm or less.

Figure 2:
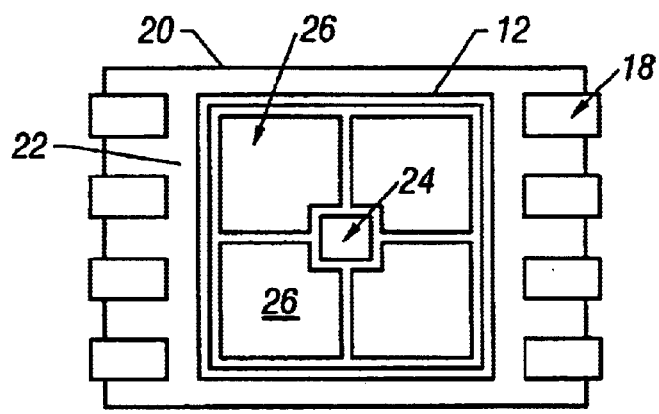
FIG. 2 shows a bottom view of the semiconductor package.

FIG. 2 shows a view of package 10 from the bottom. The bottom (frontside) of die 12 contains a gate terminal 24 and four source terminals 26 which surround gate terminal 24.

Figure 4:
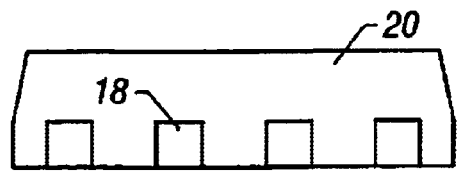
FIG. 4 shows an end view of the semiconductor package.

FIG. 4 shows a end view of semiconductor package 10, taken from direction 30 shown in FIG. 3.

FIG. 5 shows a flow chart for a process of manufacturing the semiconductor package. The process begins with the step of sawing a semiconductor wafer into individual dice. The dice are attached to leadframes (L/F) using, for example, a conductive epoxy 84-1 produced by Ablestik Electronic Materials and Adhesives. The leadframes are preformed into cup shapes as described above, with each cup having dimensions (width, length and depth) suitable to hold one of the dice. Preformed leadframes are available from many sources known to those skilled in the art.

Using a conventional injection-molding machine, plastic capsules are formed around the leadframes and dices, without touching the frontside of the die 12. Holes may be formed in the leadframe to allow the plastic material to filled the spaces between the edges of the dice and the leadframes (e.g., portion 22 in FIGS. 1 and 2). The plastic material may be the thermal set plastic 6300 H, supplied by Sumitomo of Japan.

Next, the packages are marked, and the leadframes are separated by cutting the leads (a process sometimes referred to as "singulation"). Finally, the dice can be subjected to electrical tests to ensure that they are fully operational.

Since the frontside of the die and the leads are coplanar, the package may easily be mounted on the surface of a PCB, as shown in FIG. 1.

The package of this invention is economical to manufacture and provides electrical contacts to both sides of a dice. In addition, the direct connection between the die and the PCB provides a good thermal conduction path from the die to the PCB.

Alternatively, the package can be formed as shown in the cross-sectional view of FIG. 6. In package 30 the capsule 32 is truncated, leaving the top of the leadframe is exposed. This embodiment may further improve the thermal dissipation properties of the package.

While this invention was described with reference to a vertical MOSFET, this description is to be considered illustrative and not limiting. The broad principles of this invention are applicable to any semiconductor die which is to be packaged in such a way that contact is made to both sides of the die, including integrated circuit (IC) dice that require a contact to the frontside. For example, FIG. 7 shows a bottom view of an package 40 which includes an IC die 42. Ten input/output (I/O) pads 44 are located on the frontside of IC die 42. FIG. 7 is similar to FIG. 2, with a cup-shaped leadframe being electrically connected to the backside of die 42 (typically ground) and having leads with portions 46 (similar to portions 18) that are coplanar with the frontside of die 42.

Persons skilled in the art will appreciate that numerous other embodiments may be fabricated in accordance with the broad principles of this invention.

We claim:

1. A packaged semiconductor device for mounting on a surface, said package comprising:
   a leadframe having a first portion and a second portion wherein said first portion is formed in the shape of a cup;
   a semiconductor die having a first surface and a second surface, disposed inside said first portion, wherein said first surface is attached to said first portion;
   a plurality of leads formed in said second portion, wherein each of said leads has a mounting surface that is coplanar with said second surface of said die; and
   a capsule partially enclosing said leadframe and said die, exposing the entire mounting surface of each of said leads and the entire second surface of said die.

2. The packaged semiconductor device of claim 1, wherein said semiconductor die is attached to said first portion of said leadframe by a conductive cement.

3. The packaged semiconductor device of claim 1, wherein said conductive cement is a conductive epoxy.

4. The packaged semiconductor device of claim 3, wherein said capsule comprises a thermal set plastic.

5. The packaged semiconductor device of claim 1, wherein said semiconductor die comprises a MOSFET.

6. The packaged semiconductor device of claim 5, wherein said MOSFET is a vertical MOSFET.

7. The packaged semiconductor device of claim 5, wherein said first surface comprises a drain terminal.

8. The packaged semiconductor device of claim 7, wherein said second surface comprises a gate terminal and a source terminal.

9. The packaged semiconductor device of claim 1, wherein said semiconductor die comprises an integrated circuit.

* * * * *